United States Patent [19]

Wason

[11] Patent Number: 4,556,844
[45] Date of Patent: Dec. 3, 1985

[54] APPARATUS FOR MOUNTING AN ELECTRICAL SENSING DEVICE OR ENCODER ON A DATA OUTPUT INDICATOR OR METER

[75] Inventor: Thomas D. Wason, Raleigh, N.C.

[73] Assignee: Cain Encoder Company, Greenville, N.C.

[21] Appl. No.: 547,884

[22] Filed: Nov. 2, 1983

[51] Int. Cl.⁴ ............................................. G01R 1/04
[52] U.S. Cl. .................................... 324/156; 324/113; 324/157; 340/870.02; 346/14 MR
[58] Field of Search ........................ 324/156, 157, 113; 73/431, 273; 346/14 MR; 340/870.02; 116/305

[56] References Cited

U.S. PATENT DOCUMENTS

| | | |
|---|---|---|
| 3,006,712 | 10/1961 | Eichacker ..................... 346/14 MR |
| 3,835,372 | 9/1974 | Adair ............................... 324/157 X |
| 3,846,789 | 11/1974 | Germer et al. ............ 340/870.02 X |
| 4,324,197 | 4/1982 | Parfitt ................................. 324/157 |
| 4,338,601 | 7/1982 | Nance-Kivell ................. 340/870.02 |
| 4,491,792 | 1/1985 | Bullock et al. ............. 340/870.02 X |
| 4,491,793 | 1/1985 | Germer et al. ....................... 324/157 |
| 4,500,779 | 2/1985 | Killingsworth ............ 340/870.02 X |

Primary Examiner—Stanley T. Krawczewicz
Attorney, Agent, or Firm—Charles R. Rhodes; Judith E. Garmon

[57] ABSTRACT

A pair of uniquely designed spring clips are snapped onto existing elements of a visual indicator such as the dial of a utility meter. An encoder having attachment elements with a spacing therebetween corresponding to the spacing between the clips is attached to the clips to quickly, easily, and precisely attach the encoder to the dial in properly aligned position.

4 Claims, 3 Drawing Figures

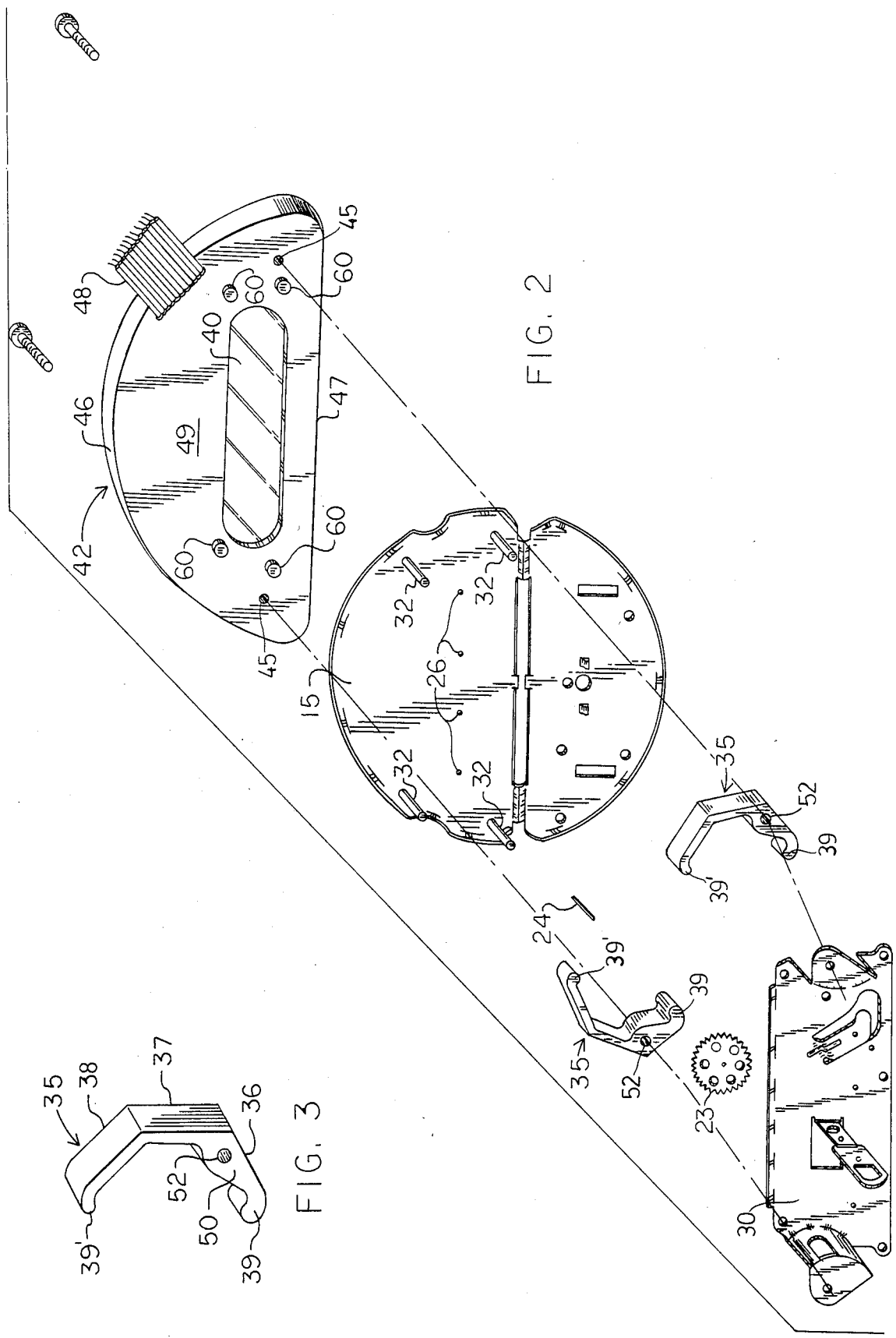

APPARATUS FOR MOUNTING AN ELECTRICAL SENSING DEVICE OR ENCODER ON A DATA OUTPUT INDICATOR OR METER

BACKGROUND OF THE INVENTION

In recent years the development and utilization of the remote reading of meters, dials, and other data output devices has increased dramatically. One area of such development is in the remote reading of utility meters. Once the data is available on the visual indicators, it must be gathered by encoders or transducers operatively connected to the meter face and forwarded to an interrogation center or data bank. At that point the data is accumulated and processed according to prescribed programs. One such encoder is shown and described in U.S. Pat. No. 4,007,454 to Cain.

Devices for mounting or connecting such sensors to the meter face have varied widely depending upon the type of meter and sensor. A universal problem with many types of meters and sensors has been the ability to mount the sensor to the face of the data output device in a way that eliminates or at least reduces the alignment error. In that regard, to electronically read the information from the meter face requires a substantial degree of precision from the standpoint of where the sensor is located with respect to the dial to be read. The problem is compounded when one recognizes that installation of the sensing apparatus may be carried out in the field by personnel having minimum training.

When installing transducers or encoders over the face of utility meters and the like, difficulties are often encountered in obtaining alignment of the sensor to the meter dial which is necessary in order to obtain accurate data from the sensor.

Prior to development of the present invention there was no known way to consistently provide for an easy and indeed critical alignment of an encoder or sensor over the dial face of a utility meter in an efficient, economical way. The present applicant was seeking a means of accomplishing such installation by existing personnel absent sophisticated and expensive training, and to make such installation essentially "error proof".

The present invention is thus directed to a means for housing an encoder or other electrical sensing device and for easily, quickly, and precisely mounting the housing on a visual indicator or output meter. In a preferred embodiment the invention is directed to the design of such a housing and to the mounting thereof in such critical alignment as to substantially eliminate errors in computation of data. The mounting apparatus of the present invention is further designed to overcome the likelihood of human error in aligning the encoder over the dials by providing a virtually "foolproof" means for installation.

Such installation is accomplished by means of a cooperating pair of unique mounting clips designed to be quickly and simply snapped onto an existing element of a standard utility meter. Because of the way the clips are designed, the subsequent mounting of the encoder housing in proper position is automatic and substantially error proof.

Basically, the present invention includes a housing which is essentially a molded frame for supporting the encoder itself, which housing can only be attached to the aforementioned mounting clips in one position. The clips include apertures therethrough or notches for receiving a mounting post, screw or other fastening member extending from the housing. When the housing is aligned with the apertures on the clips after the clips are snapped on the meter, and the attaching means (screws, mounting posts, and the like) inserted into the apertures, the encoder which is visibly framed in the housing will be critically aligned over the meter dials.

Conventional utility meters are generally similar in design as far as the manner in which the meter hands are attached to the drive gears. The dial faces and rotating meter hands are mounted on a face plate, arranged such that they provide a reading of kilowatt hours of electrical usage in a residential or other facility. Other meters provide data on use of water, gas, etc., all of which data is gathered periodically by the utility company. To the rear of the face plate and spaced therefrom, is a support plate which supports the gears and other components which are operatively connected to the rotating meter hands. The two plates (face plate and support plate) serve as bearings for the dial shafts, and are attached to each other by a plurality of posts, generally a pair on each side, approximately ⅜ of an inch long. The posts serve to join the two plates, to space them sufficiently apart to allow room for the gears and other operative components, and to provide fixed reference points with respect to which the rotating shafts are located during fabrication of the meter.

Principally because of the last of the aforementioned functions, the aforesaid pairs of posts on the meter provide a desirable attachment means for the uniquely designed clips of the present invention. Thus, in use, it is a simple operation for personnel to first snap a clip on each pair of spacing posts, align the housing on the clips and join the aligned housing and clips with screws, mounting posts, or other similar joining techniques. Once secured in such a way, the sensor is automatically and precisely aligned with the meter dials. The remainder of the installation procedure is a matter of connecting the electrical leads from the sensor to the interrogation unit, a procedure which does not form part of the present invention.

Therefore, the objectives of the present invention includes the provision of a means for mounting a sensing device to a visual indicator such that the critical alignment of the two components is substantially ensured. Further, an object of the invention is the provision of such a mounting system that can be installed by personnel without special training. Further objectives are the provision of a housing for an encoder and related circuitry, which housing is efficiently and economically attached to conventional models of utility meters. Other and further objectives and advantages of the present invention will become apparent to those skilled in the art as the following detailed description is studied in conjunction with the following drawings, of which:

FIG. 2 is an enlarged, exploded perspective view taken from the rear and one side of the meter and housing, allowing the alignment for installation; and FIG. 3 is a detailed perspective of a preferred embodiment of the clip.

DETAILED DESCRIPTION OF A PREFERRED EMBODIMENT

Figure 1:
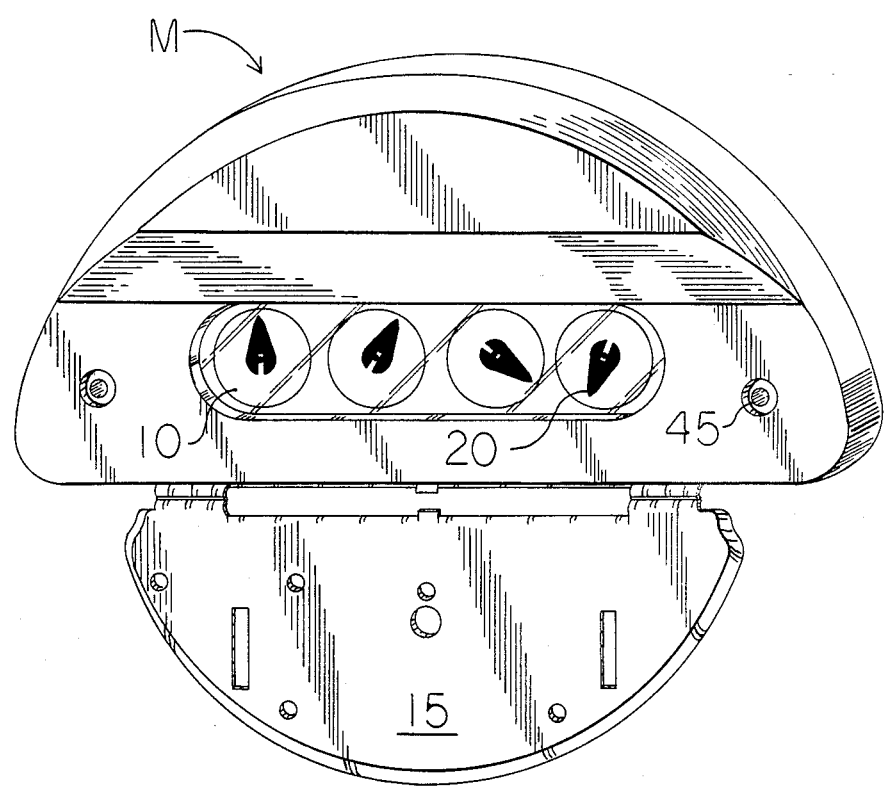
FIG. 1 is a perspective view of the present invention as mounted on a conventional meter with parts of the meter cover broken away.

Looking first at FIG. 1 of the drawings, a conventional utility meter M includes a plurality of meter dials 10 across the front of a face plate 15. For illustrative purposes only, the meter shown is of the type used for measuring kilowatt hours of electrical usage. However, it must be understood that the present invention, with only simple modifications, can be installed and utilized on virtually any known utility meter or data output device which uses one or more rotating hands.

The dials 10 and the rotating hands 20 on each dial are the visual indicators used for determining the number of kilowatt hours used by a particular facility. The rotating hands 20 are connected to a plurality of gears (not shown) which are positioned behind face plate 15 and mesh with other gears mounted on support plate 30 (FIG. 2). Plate 30 functions as a gear support plate by providing a means for mounting and supporting the gear shafts through holes 26.

To attach the gear support plate 30 to plate 15, a typical meter dial assembly contains a plurality of posts 32, approximately three-eights of an inch long mounted between the two plates, one at each corner of the gear plate 30. Because these posts typically served as reference points during the construction of the dial assembly, the position of the gears 23, the shafts 24 and dial faces 10 are accurately known with respect to these posts. Because of this fact, it is to these posts that the unique mounting clips 35 of the present invention are to be attached.

As best shown in FIGS. 2 and 3, the sensing device or encoder 40 is supported and framed within housing 42 which, in turn, is attached to the aforesaid mounting clips 35. The detail of the mounting is most clearly illustrated in FIG. 2. Because the gear plate is of a substantially rectangular shape, the posts 32 are effectively in pairs; one pair supporting each end of the plate 30.

To utilize these posts which are present in most models of conventional utility meters, mounting clips 35 are designed to that they can be easily snapped onto opposing pairs of posts. Best shown in FIG. 3, the clips are of a unique shape generally having three segments 36, 37 and 38. Sides 36 and 38 further include inwardly turned portions which form gripping or post engagement means 39,39'. The distance between the aforesaid post engagement means 39,39' is slightly less than the distance between the corresponding pair of posts onto which the clip 35 is snapped. Also, the material from which the clip is made and the design of legs 37,38 provide a spring effect in the clip legs so that the aforesaid snapping action occurs. The post engagement means 39 on segment 36 is slightly more inwardly curved than engagement means 39' and wraps further around the register post. This allows for a more secure, but easily installed locking or gripping engagement of the clip onto the post because means 39 seats around a substantial portion of the circumference of the post 32, while gripping means 39' is easily snapped into place around a lesser portion of the opposite post.

As shown in FIGS. 2 and 3, side 38 further includes an inwardly projecting enlarged portion or shoulder 50 with an aperture or notch 52 therethrough. When the clip is snapped onto the pair of posts 32, the shoulder 50 and the aperture 52 extend outwardly beyond the periphery of the round face plate 15 for access to a fastener. When both clips are positioned, a shoulder 50 protrudes from the plate 15 at approximately three o'clock and nine o'clock. The apertures 52, as previously explained, receive a fastening post 45, screw or other type of fastener, therethrough. While the illustrated embodiment utilizes a fastening post molded to the rear of housing 42 and extendable into apertures 52, it should be realized that the housing could include openings aligned with apertures 52. Then separate fastening elements such as screws could be used to secure housing 42 in proper position. Alternatively, the clips could contain posts which engage openings in the housing.

The housing 42 is generally semi-circular in shape, having an arcuate side 46 and a straight side 47. The encoder 40 is framed in a portion thereof just above the straight side 47. The portion of the housing above the encoder may be slightly enlarged, or thickened, and contain at least a segment of the circuits which are operatively related to the encoder 40. As shown, the electrical leads 48 extend from the encoder circuitry (not shown) through the rear wall 49 of the housing. The leads 48, shown broken away, are ultimately connected to a distant interrogation unit.

The housing rear wall 49 also includes three or more pads or bosses 60, two just above the straight side 46 approximately at the lower side edges of the encoder, and one or two at the upper edges of the encoder. These pads 60 function as spacing mechanisms to maintain the rear wall 49 a prescribed distance from the face plate 15.

As previously explained, the alignment of the encoder over the dial face is critical to proper operation of the mechanism. If not properly aligned, the data gathered by the encoder will be incorrect and worthless. Thus the attachment posts 45 on the housing must be critically positioned with respect to each other and in relationship to the apertures 52 on the shoulder, such that the encoder is properly aligned with the dial faces 10.

The housing 42 is preferably molded from a polymeric material of a rigid, durable nature. The circuits of the encoder are embedded therein during the molding process.

The clips are made from a metallic or plastic material, extruded and then sawed to proper thickness to form the finished clip. It could also be a wire form, injection molding, or a metal stamping. Thus constructed, the mounting apparatus is easily installed by simply snapping the clips 35 onto each pair of spacing posts 32, and aligning and inserting the fastening posts 45 from housing 42 therein to attach the housing to the clips. The glass dome or utility meter cover C is then replaced over the meter. The cover C protects not only the meter, but also the encoder from dirt and debris.

Although a preferred embodiment has been described, it is recognized that the shape of the clips 35 can be altered to be compatible with other meters and manufacturing techniques. All of these modifications are embodied in the scope of the claims below.

What is claimed is:

1. An apparatus for mounting a sensing means adjacent the face of a device having one or more movable, visual indicators thereon of a type for indicating data output from any of various sources, where said indicators are mounted on shafts extending through said face plate and at least some of the operative components of the indicators are mounted on a support plate which is secured to the rear of the face plate by means of opposing pairs of post members, one pair of posts being on each opposite side of said face plate, said mounting apparatus comprising:

(a) a housing for said sensing means;
(b) a plurality of clips having a length and configuration such that one of said clips can be snap-locked onto one of said pairs of spaced post members;
(c) means for securing, in a prescribed alignment, said housing to said clips;

whereby said sensing means, when so mounted, is in correct operative alignment with said movable indicators for correctly sensing the data output thereof.

2. A mounting apparatus according to claim 1 wherein said means for securing said housing to said clips comprises:

(a) said clips having an aperture extending through a portion thereof;
(b) said housing including an opening through each side periphery for receiving a fastener means therethrough; said openings being positioned on said housing such that said openings will align with the apertures in said clips when the sensing means is properly positioned over the visual indicators;
(c) fastener means for insertion through said aligned holes and apertures for securing said housing to said clips.

3. A mounting apparatus according to claim 1 wherein said housing further includes a means for attaching a plurality of electrical leads.

4. A mounting apparatus according to claim 1 wherein said means for securing said housing to said clips comprises:

(a) said clips having a post protruding therefrom;
(b) said housing including an opening through each side periphery for receiving the post protruding from the clip; said opening being positioned on said housing such that said opening will align with the posts on said clips when the sensing means is properly positioned over the visual indicators.

* * * * *